United States Patent [19]

Romero

[11] Patent Number: 5,465,481
[45] Date of Patent: Nov. 14, 1995

[54] METHOD FOR FABRICATING A SEMICONDUCTOR PACKAGE

[75] Inventor: Guillermo L. Romero, Phoenix, Ariz.

[73] Assignee: Motorola, Inc., Schaumburg, Ill.

[21] Appl. No.: 130,824

[22] Filed: Oct. 4, 1993

[51] Int. Cl.⁶ .................................................. H05K 3/34
[52] U.S. Cl. ........................... 29/840; 174/52.4; 437/218
[58] Field of Search .................... 29/840, 827; 437/218; 174/52.4, 52.2

[56] References Cited

U.S. PATENT DOCUMENTS

| | | | |
|---|---|---|---|
| 4,217,684 | 8/1980 | Brisken et al. | 29/840 X |
| 4,355,463 | 10/1982 | Burns | 29/827 X |
| 4,390,220 | 6/1983 | Benasutti | 174/52.4 X |
| 4,577,056 | 3/1986 | Butt | 174/52.4 |
| 4,633,573 | 1/1987 | Scherer | 174/52.4 X |
| 4,635,093 | 1/1987 | Ross | 174/52.4 X |
| 4,661,653 | 4/1987 | Aigo | 174/52.4 |
| 4,763,407 | 8/1988 | Abe | 29/840 |
| 4,780,572 | 10/1988 | Kondo et al. | 174/52.4 |
| 4,788,626 | 11/1988 | Neidig et al. | 361/386 |
| 4,814,943 | 3/1989 | Okuaki | 174/52.2 X |
| 4,831,212 | 5/1989 | Ogata et al. | 174/52.4 |
| 4,853,491 | 8/1989 | Butt | 174/52.4 |
| 4,859,640 | 8/1989 | Newkirk | 501/128 |
| 4,959,900 | 10/1990 | de Girery et al. | 29/840 |
| 4,960,736 | 10/1990 | Luxzcz et al. | 501/127 |
| 5,007,475 | 4/1991 | Kennedy et al. | 164/97 |
| 5,020,583 | 6/1991 | Aghajanian et al. | 164/97 |
| 5,105,536 | 4/1992 | Neugebauer et al. | 29/832 |
| 5,148,264 | 9/1992 | Satriano . | |
| 5,158,912 | 10/1992 | Kellerman et al. | 437/218 |
| 5,163,499 | 11/1992 | Newkirk et al. . | |
| 5,221,558 | 6/1993 | Sonuparlak et al. | 427/376.1 |
| 5,222,542 | 6/1993 | Burke | 164/97 |
| 5,256,901 | 10/1993 | Ohashi et al. | 174/52.4 X |
| 5,263,242 | 11/1993 | Singh Deo et al. | 174/52.4 X |

OTHER PUBLICATIONS

6th Intr SAMPE Electron Conf Jun. 22–25, 1992 pp. 295–307 a paper by J. A. Horner et al.

*Primary Examiner*—Carl J. Arbes
*Attorney, Agent, or Firm*—William E. Koch

[57] ABSTRACT

A semiconductor package (100) and module (300) includes a unitary base structure (101) and alignment mechanisms (104). The unitary base structure (101) includes a semiconductor mounting area (102) and encircling walls (103). The structure provides resistance to bowing as compared to a flat base. The lack of bowing provides improved thermal contact to a cold plate of the operating environment. The lack of bowing also reduces certain failure modes. The alignment mechanism (104) aligns module components during assembly, thereby simplifying assembly by eliminating the need for complicated fixtures which hold components in place.

14 Claims, 2 Drawing Sheets

METHOD FOR FABRICATING A SEMICONDUCTOR PACKAGE

BACKGROUND OF THE INVENTION

The present invention relates, in general, to semiconductor packages and modules, and more particularly, to semiconductor packages and modules comprising unitary base structures.

In the past, semiconductor device modules such as high power switching modules have comprised a large flat stamped metallic heatsink at the bottom of the module. The stamped heatsink provides support for the remainder of the components of the module and provides the thermal interface between the module and a cold plate in the operating environment. The flat stamped heatsink of the conventional semiconductor module gives rise to certain substantial disadvantages.

Because the stamped flat heatsink does not encircle or enclose the remainder of the module components, there is no convenient way for the remainder of the module components to be positioned during fabrication of the module. Typically, complicated fixtures are used to hold components in place while the module is assembled.

Furthermore, the stamped flat heatsink is highly susceptible to bowing due to mismatches in thermal coefficients of other portions of the module and also due to stresses induced when the module is mounted on the cold plate of the operating environment. When the module is bowed it does not mate well with the cold plate of the operating environment.

What is needed is a semiconductor package and module structure which does not rely on complicated fixturing during assembly and which resists bowing along the bottom surface of the module.

DETAILED DESCRIPTION OF THE DRAWINGS

Generally, the present invention provides a method and apparatus for fabricating a semiconductor package and module. In a preferred embodiment, the invention provides a metal unitary enclosing structure, or box, for a power module. The box acts as a heatsink and can be fashioned with integral slots, pins, etc. to provide alignment for the components comprising the power module. Consequently, complicated fixturing for holding components in place during assembly is not required. Furthermore, since the heatsink is an enclosing structure, or box, it is highly resistive to bowing from thermal mismatches of other components and from stresses induced during mounting. Consequently, the module in accordance with the present invention will mate better with the cold plate of the operating environment, thereby providing improved thermal conductivity. Additionally, the lack of bowing substantially reduces failure modes of the power module.

More specifically, the preferred embodiment of the present invention is accomplished by combining a metal matrix composite (MMC) and a ceramic in a molding and bonding process to form the box which is a unitary structure having a bottom and sidewalls. In one embodiment, a ceramic layer is placed into the bottom of a molded porous silicon carbide (SiC) preform. Molten aluminum (Al) is infiltrated into the preform, thereby reinforcing the preform and simultaneously bonding the newly formed SiC/Al MMC to the ceramic layer. Furthermore, the structure is designed having a very high stiffness to resist warping during the various packaging processes and a slightly convexed bottom surface for intimate thermal contact with a cold plate during mounting.

The present invention can be more fully understood with reference to FIGS. 1–4. In these figures, the matrix material referenced is SiC. The infiltrating material referenced is Al, and the ceramic material referenced is aluminum nitride AlN. This invention is not limited to these materials, although this is the preferred embodiment. There are other matrix materials such as nickel, iron-silver composites. Other infiltrating materials that can be used are aluminum alloys, copper or copper alloys, and other metals. Aluminum oxide may be used as the ceramic. The preceding examples given are representative and not all inclusive.

Figure 1:
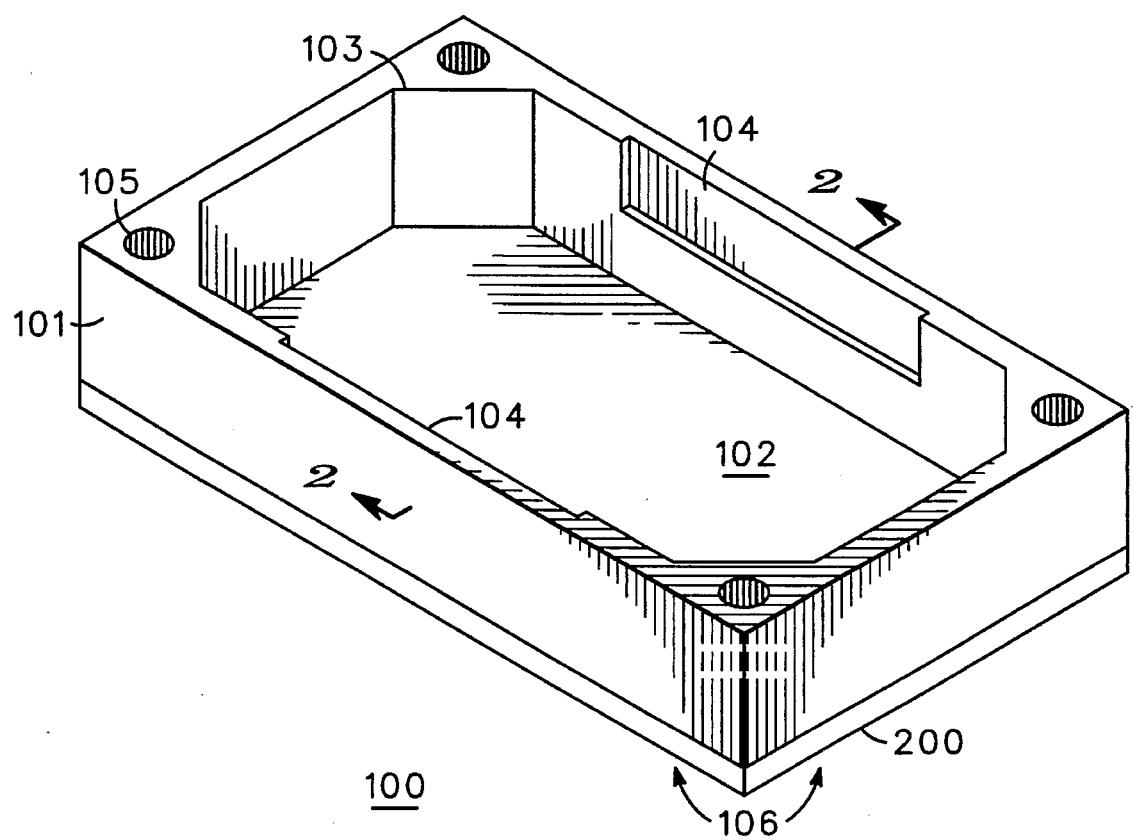
FIG. 1 is a perspective view illustrating a semiconductor package in accordance with a preferred embodiment of the present invention.

FIG. 1 illustrates a semiconductor package 100 that includes a unitary base structure 101, a semiconductor mounting area 102, encircling walls 103, an alignment mechanism 104, mounting holes 105 and a convexed bottom surface 106. More specifically, the SiC/Al unitary base structure formation process begins by the combining powdered SiC with a bonder to form a slurry. The slurry is then molded using standard molding technology into the desired shape. The bonders are removed by placing the molded structure into a hot furnace for some time. The porous structure that remains is known as a "green preform". Al is then infiltrated at high temperatures into the preform. Since the Al is molten and the preform is porous, the Al will completely fill the porosity of the preform through capillary flow, thereby reinforcing the SiC and forming the metal matrix composite.

The unitary base structure 101, comprising semiconductor mounting area 102 and encircling walls 103, has a very high stiffness since its moment of inertia is such that it behaves similar to an I-beam when subjected to stresses and bending moments. This is desirable because during package assembly, the different coefficients of thermal expansion of the various materials in the package generate high stresses. These stresses can warp a base plate structure so as to accelerate failure mechanisms such as fatigue, cracking, and delamination between layers. The unitary base structure 101 comprising semiconductor mounting area 102 and encircling walls 103 resists deformations because of its shape, as compared to a flat two-dimensional base plate.

The bottom surface of the unitary base structure 101 has a molded spherically convexed bottom 106. In the preferred embodiment, the convexity is less than a 0.254 mm bow across the diagonal length of the base plate, and therefore not noticeable in the FIGS. Bottom 106 is shaped such that when placed on a flat surface, the structure would tend to rock slightly. The purpose of having a slightly convexed bottom surface is to facilitate intimate thermal contact between the semiconductor package and the cold plate of the operating environment. During mounting, the applied forces at the corners of the package create a uniform bending moment on the structure. If the bottom surface were flat, the moment would bend the package up in the center and would normally create an air gap between the center of the bottom surface and the cold plate mounting surface. Since air is a very poor thermal conductor the resulting mounted package would exhibit poor heat transfer. However, by providing a slightly convexed bottom surface in accordance with a preferred embodiment of the present invention, the applied force at the four corners tends to flatten out the package, maintaining intimate thermal contact with the entire mounting area.

Figure 2:
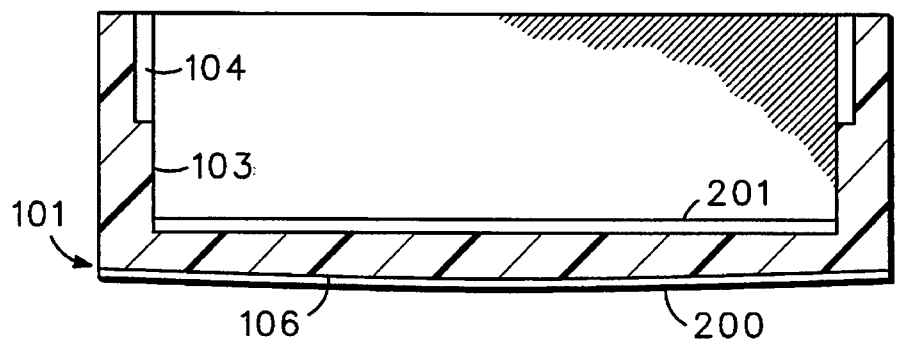
FIG. 2 is a cross-section view of the package shown in FIG. 1.

FIG. 2 illustrates a cross-sectional view of the semiconductor package 100. As illustrated by this view, the semiconductor package 100 further includes base bottom layer 200 and a ceramic layer 201. The ceramic layer 201 is typically an AlN substrate. When the package 100 is fabricated, the substrate is placed within the uninfiltrated molded preform so that one side of the ceramic is in contact with the preform. The Al infiltrates to the preform-ceramic interface to form a bond between the two materials. This bond forms the unitary base structure 101, comprising the SiC/Al MMC and the ceramic layer.

Convexed bottom surface 106 is fabricated of the infiltrated material during the infiltration step. This is accomplished by leaving an empty region (less than 0.381 mm thick) in the mold cavity adjacent the bottom surface of the preform. This region is filled with the infiltrating material. Since convexed bottom surface 106 is made out of a metal or metal alloy, it is malleable. Convexed bottom surface 106 therefore tends to deform during mounting and tends to fill any air gaps that may be present. The soft convexed bottom layer thus provides intimate thermal contact between the package and the cold plate.

Figure 3:
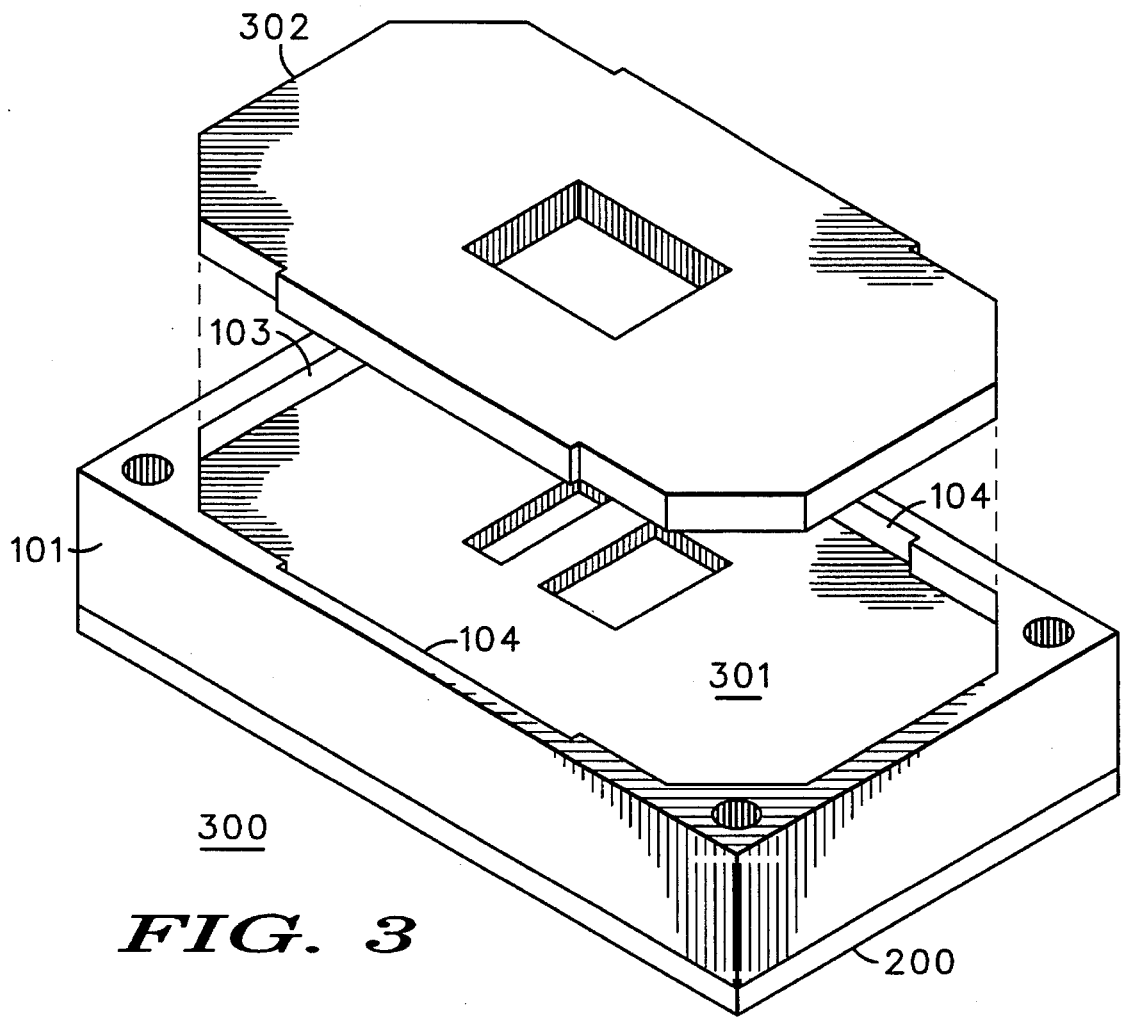
FIG. 3 is a perspective view of a partially assembled semiconductor module in accordance with a preferred embodiment of the present invention.

FIG. 3 illustrates a semiconductor module 300 that includes unitary base structure 101 having encircling walls 103, an alignment mechanism 104, control circuit board 301 and package lid 302. The control circuit board 301 may be a standard printed circuit board material (FR4 board) with components on one or two sides (components not shown). Board 301 is generally used to control the power electronic components (shown in FIG. 4) mounted on semiconductor mounting area 102. Control circuit board 301 is aligned with alignment mechanism 104 so that no additional fixturing is required during assembly in order to position the control board 301 within unitary base structure 101. In the preferred embodiment, board 301 is shaped to fit within the slots of alignment mechanism 104, thereby being aligned.

Package lid 302 is typically made out of an epoxy material or other plastic material capable of withstanding the operating temperatures of the package. Preferably, the size of the package lid is large enough so as to barely fit within the encircling walls 103, or somewhat smaller so as to leave a distance between the lid and the walls 103. Alignment mechanism 104 is also used to position package lid 302 with respect to unitary base structure 101.

Figure 4:
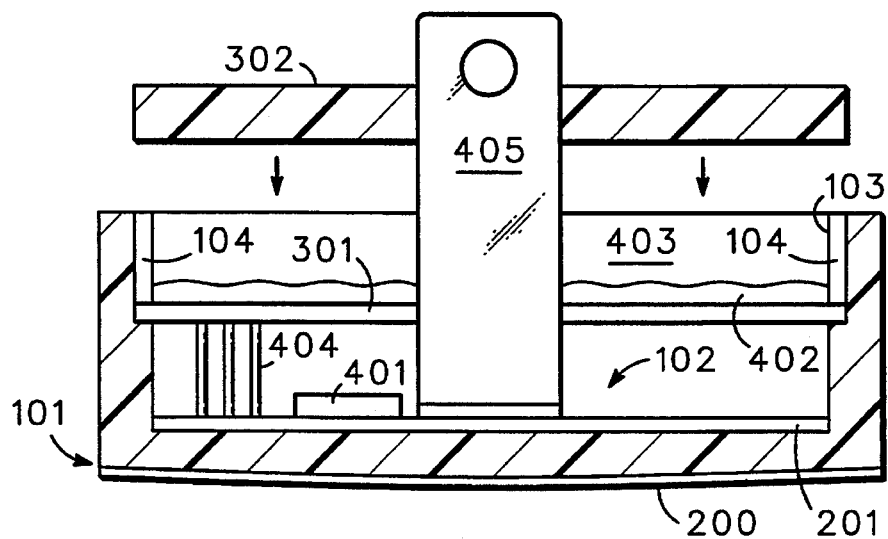
FIG. 4 is a cross-section view of the module of FIG. 3, further illustrating module components.

FIG. 4 illustrates a cross-sectional view of the semiconductor module 300. As shown, the semiconductor module 300 further comprises semiconductor device 401 positioned in semiconductor mounting area 102. The module 300 additionally comprises control leads 404 connecting control circuit board 301 to semiconductor mounting area 102. Module 300 further comprises silicone gel 402 filling the module up past control circuit board 301. Additionally, module 300 includes epoxy layer 403 filling the remainder of the module, up to the top of encircling walls 103. FIG. 4 additionally illustrates power lead 405 which provides an electrode to the semiconductor device.

In order to fabricate the module, unitary base structure 101 is provided with ceramic layer 201 in place as described above. Semiconductor device 401 (along with others, depending upon the particular application) is positioned on ceramic layer 201. Ceramic layer 201 additionally includes metal traces as needed for circuit connections. Additionally, during assembly circuit control board 301 is positioned within unitary body 101 using alignment mechanism 104 for alignment. Power leads 405 and control leads 404 are positioned in unitary body 101 in a similar manner, taking advantage of an alignment mechanism, depending upon the particular design.

Silicone gel 402 is inserted into unitary body 101 to a level above control circuit board 301. Silicone gel 402 provides protection from the environment for the circuitry on board 301 as well as the circuitry in the semiconductor mounting area. Additionally, silicone gel 402 provides a support mechanism for control leads 404. In other embodiments, however, a physical support mechanism may take the form an extra slot formed in the side of unitary body 101. The slot would provide space and support for leads between board 301 and the semiconductor mounting area 102.

Following the silicone gel, epoxy 403 is inserted in unitary body 101 up to the top level of encircling walls 103. Finally, package lid 302 is attached according to well known methods. It should be understood that the order of the steps discussed is not necessarily important, and other intermediate steps which are well known in the industry may be required for particular applications. For example, more than one circuit board may be required for some applications. By now it should now be appreciated that the preferred embodiment of the present invention provides an improved method and apparatus for fabricating a semiconductor package and semiconductor module with advantages including resistance to bowing and inherent alignment. Consequently, the preferred embodiment of the present invention provides improved thermal contact to the cold plate of the operating environment and reduced failure rates. Additionally, assembly is greatly simplified due to inherent alignment.

I claim:

1. A method for fabricating a semiconductor package, the method comprising the steps of:

fabricating, from a porous matrix material, a unitary base structure that includes encircling walls and a mounting area for mounting a semiconductor device, the step of fabricating including forming an alignment mechanism in at least one of the walls for aligning the semiconductor device in the unitary base structure; and infiltrating the unitary base structure with a conductive material to substantially fill the porous matrix material.

2. The method of claim 1, further comprising the step of attaching a ceramic layer in the semiconductor device mounting area.

3. The method of claim 1, wherein the step of fabricating comprises fabricating using a material selected from the group consisting of silicone carbide and a composite of silver, iron, and nickel.

4. The method of claim 1, wherein the step of infiltrating comprises infiltrating with one of a metal or a metal alloy.

5. The method of claim 1, wherein the step of fabricating comprises forming a concave bottom surface on the unitary base structure.

6. The method of claim 1, further comprising the step of forming, from the conductive material, a base bottom layer on a bottom surface of the unitary base structure.

7. A method for fabricating a semiconductor module, the method comprising the steps of:

provide a unitary base structure that includes a semiconductor device mounting area and encircling walls;

attaching a layer of ceramic material in the mounting area;

mounting a semiconductor device to the ceramic material; and connecting at least one electrode to the semiconductor device.

8. A method for fabricating a semiconductor module as claimed in claim 7, further including disposing a layer of conductive material between the layer of ceramic material and the semiconductor device.

9. A method for fabricating a semiconductor module as claimed in claim 7, further including forming an interconnect support mechanism in the unitary base structure.

10. A method for fabricating a semiconductor module as claimed in claim 7 further including mounting a lid to the unitary base structure.

11. A method for fabricating a semiconductor module, the method comprising the steps of:

providing a unitary base structure that includes a semiconductor device mounting area and encircling walls;

mounting a semiconductor device to the semiconductor device mounting area;

connecting at least one electrode to the semiconductor device; and mounting a circuit board to a notch in one of the walls.

12. A method for fabricating a semiconductor module as claimed in claim 11 further comprising the steps of:

covering the semiconductor device with a silicone gel; and placing an epoxy over the silicone gel.

13. A method for fabricating a semiconductor module as claimed in claim 11 further comprising the step of:

attaching a layer of ceramic material between the mounting area and the semiconductor device.

14. A method for fabricating a semiconductor module as claimed in claim 11 further comprising the step of:

placing another semiconductor device on the circuit board; and electrically coupling the semiconductor devices.

* * * * *